US009935651B1

(12) United States Patent
He et al.

(10) Patent No.: US 9,935,651 B1
(45) Date of Patent: Apr. 3, 2018

(54) DATA TRANSMISSION METHOD AND APPARATUS (71) Applicant: BEIJING BAIDU NETCOM SCIENCE AND TECHNOLOGY CO., LTD., Beijing (CN)

(72) Inventors: Wei He, Beijing (CN); Liming Xia, Beijing (CN); Yu Ma, Beijing (CN); Kaiwen Feng, Beijing (CN); Yibing Liang, Beijing (CN); Zhuo Chen, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/410,642

(22) Filed: Jan. 19, 2017

(30) Foreign Application Priority Data

Sep. 12, 2016  (CN) .......................... 2016 1 0817396

(51) Int. Cl.
*H03M 7/30* (2006.01)
*H04N 21/23* (2011.01)

(52) U.S. Cl.
CPC .............. *H03M 7/30* (2013.01); *H04N 21/23* (2013.01)

(58) Field of Classification Search
None
See application file for complete search history.

(56) References Cited

U.S. PATENT DOCUMENTS

| 6,407,680 | B1* | 6/2002 | Lai | H04N 7/17318 341/50 |
| 7,242,324 | B2* | 7/2007 | Lai | H04N 7/17318 341/50 |
| 8,776,161 | B2* | 7/2014 | Gazier | H04N 21/222 375/240.07 |
| 2010/0239001 | A1* | 9/2010 | Watanabe | H04N 7/17318 375/240.12 |
| 2013/0343450 | A1* | 12/2013 | Solka | H04N 19/40 375/240.03 |

OTHER PUBLICATIONS

Taniar, David (editor), Encyclopedia of Mobile Computing and Commerce, copyright Apr. 2007 IGI Global, pp. 428-429 ISBN 1599040034, 9781599040035; retrieved via Google Books.*

* cited by examiner

*Primary Examiner* — Howard Williams
(74) *Attorney, Agent, or Firm* — Lathrop Gage LLP (57) ABSTRACT

The present application discloses a data transmission method and apparatus. A specific implementation of the method includes: receiving to-be-transmitted data sent from an information sending end, and determining a sending coding type of the to-be-transmitted data; determining a receiving coding type of an information receiving end receiving the to-be-transmitted data; converting the to-be-transmitted data from the sending coding type to the receiving coding type using a preset transcoding model, to obtain transcoded transmission data, the transcoding model representing a corresponding relationship between the sending coding type and the receiving coding type; and sending the transcoded transmission data to the information receiving end. This implementation improves the data transmission efficiency.

9 Claims, 5 Drawing Sheets

DATA TRANSMISSION METHOD AND APPARATUS

CROSS REFERENCE TO RELATED APPLICATIONS

This application claims the priority of Chinese Patent Application No. 201610817396.8, entitled "Data Transmission method and apparatus," filed on Sep. 12, 2016, the content of which is incorporated herein by reference in its entirety.

TECHNICAL FIELD

The present application relates to the field of data processing technology, specifically to the field of data format conversion technology, and more specifically to a data transmission method and apparatus.

BACKGROUND

Automobiles extend people's travel range, provide travel convenience to people and improve people's quality of life. With the development and progress of science and technology, driverless vehicles controlled by intelligent systems have become an important trend in future automobile development because they can acquire more driving information than manned vehicles and have higher security.

Driverless vehicles use a robot operating system to perform information transmission, and rely on the collaboration of an artificial intelligence module, a visual computing module, a video camera module, a radar sensor module, a laser radar module, and a Global Positioning System (GPS) module, so that the driverless vehicles can automatically and safely travel with no assistance.

However, there are still some shortcomings in processing data in the existing driverless vehicles. A driverless vehicle generally includes a sensor processing node, a perceptual computing node, a decision and control node, etc. The types of the data directly transmitted by the nodes are usually different. There are generally two methods for implementing data transmission or data transcoding between the nodes. In a first method, a data transcoding module is arranged between any two nodes. When there are a large number of nodes, a plurality of data transcoding modules are required. In a second method, a plurality of data output ports is arranged at a node output port for subsequent receipt of designated types of data at the node. These two methods either add numerous additional modules, increasing the probability of errors in the data transmission process, or consume more data processing capacity at each node, increasing the data traffic, and having no possibility to change the encoding of the to be transmitted data in time when the encoding format or encoding rule changes, eventually reducing the information transmission efficiency and the transcoding accuracy of the driverless vehicle.

SUMMARY

The present application provides a data transmission method and apparatus, so as to solve the technical problem mentioned in the foregoing Background section.

According to a first aspect, the present application provides a data transmission method, comprising: receiving to-be-transmitted data sent from an information sending end, and determining a sending coding type of the to-be-transmitted data; determining a receiving coding type of an information receiving end receiving the to-be-transmitted data; converting the to-be-transmitted data from the sending coding type to the receiving coding type using a preset transcoding model, to obtain transcoded transmission data, the transcoding model representing a corresponding relationship between the sending coding type and the receiving coding type; and sending the transcoded transmission data to the information receiving end.

In some embodiments, the receiving to-be-transmitted data sent from the information sending end, and determining the sending coding type of the to-be-transmitted data comprises: querying sending coding type information of the to-be-transmitted data; and determining the sending coding type of the to-be-transmitted data based on the sending coding type information.

In some embodiments, the determining the receiving coding type of the information receiving end receiving the to-be-transmitted data comprises: determining an information receiving end corresponding to the to-be-transmitted data, and sending a request message to the information receiving end, the request message querying a receiving coding type of the information receiving end; and receiving a response message sent by the information receiving end in response to the request message, the response message indicating a receiving coding type corresponding to the information receiving end.

In some embodiments, the method further comprises: a step of building a transcoding model, the step of building a transcoding model comprising: acquiring sending coding type information from information sending ends to form a sending coding type information set and acquiring receiving coding type information from information receiving ends to form a receiving coding type information set; determining a decoding module for a sending coding type corresponding to the sending coding type information, the decoding module decoding to-be-transmitted data of the sending coding type into data contents of a designated type, the data contents comprising at least one of: text, picture, and video; determining an encoding module for converting the data contents into transcoded transmission data, the transcoded transmission data being of a receiving coding type corresponding to the receiving coding type information, for data processing by the information receiving end; and encapsulating the decoding module and the encoding module into a transcoding model corresponding to the sending coding type information and the receiving coding type information.

In some embodiments, the converting the to-be-transmitted data from the sending coding type to the receiving coding type using the preset transcoding model, to obtain transcoded transmission data further comprises: updating the transcoding model using the receiving coding type of the to-be-transmitted data if the transcoding model cannot convert the to-be-transmitted data into the transcoded transmission data.

According to a second aspect, the present application provides a data transmission apparatus, comprising: a sending coding type querying unit, for receiving to-be-transmitted data sent from an information sending end, and determining a sending coding type of the to-be-transmitted data; a receiving coding type querying unit, for determining a receiving coding type of an information receiving end receiving the to-be-transmitted data; a data conversion unit, for converting the to-be-transmitted data from the sending coding type to the receiving coding type using a preset transcoding model, to obtain transcoded transmission data, the transcoding model representing a corresponding relationship between the sending coding type and the receiving coding type; and a data sending unit, for sending the transcoded transmission data to the information receiving end.

In some embodiments, the sending coding type querying unit comprises: a coding type information querying subunit, for querying sending coding type information of the to-be-transmitted data; and a coding type determining subunit, for determining the sending coding type of the to-be-transmitted data based on the sending coding type information.

In some embodiments, the receiving coding type querying unit comprises: a request message sending subunit, for determining an information receiving end corresponding to the to-be-transmitted data, and sending a request message to the information receiving end, the request message querying a receiving coding type of the information receiving end; and a response message receiving subunit, for receiving a response message sent by the information receiving end in response to the request message, the response message indicating a receiving coding type corresponding to the information receiving end.

In some embodiments, the apparatus further comprises: a transcoding model building unit, for building a transcoding model, the transcoding model building unit comprising: a coding type information set constructing subunit, for acquiring sending coding type information from information sending ends to form a sending coding type information set and acquiring receiving coding type information from information receiving ends to forma receiving coding type information set; a decoding module determining subunit, for determining a decoding module for a sending coding type corresponding to the sending coding type information, the decoding module decoding to-be-transmitted data of the sending coding type into data contents of a designated type, the data contents comprising at least one of: text, picture, and video; an encoding module determining subunit, for determining an encoding module for converting the data contents into transcoded transmission data, the transcoded transmission data being of a receiving coding type corresponding to the receiving coding type information, for data processing by the information receiving end; and a transcoding model building subunit, for encapsulating the decoding module and the encoding module into a transcoding model corresponding to the sending coding type information and the receiving coding type information.

In some embodiments, the data conversion unit further comprises: a transcoding model updating subunit, for updating the transcoding model using the receiving coding type of the to-be-transmitted data if the transcoding model cannot convert the to-be-transmitted data into the transcoded transmission data.

According to the data transmission method and apparatus provided by the present application, first, a sending coding type of data to be transmitted and a receiving coding type of an information receiving end receiving the data to be transmitted are determined; then, the data to be transmitted is converted from the sending coding type to the receiving coding type by using a corresponding transcoding model, to obtain transcoded transmission data. Thereby, the data transmission efficiency is improved.

BRIEF DESCRIPTION OF THE DRAWINGS

Other features, objectives and advantages of the present application will become more apparent upon reading the detailed description to non-limiting embodiments with reference to the accompanying drawings, wherein.

DETAILED DESCRIPTION OF EMBODIMENTS

The present application will be further described below in detail in combination with the accompanying drawings and the embodiments. It should be appreciated that the specific embodiments described herein are merely used for explaining the relevant invention, rather than limiting the invention. In addition, it should be noted that, for the ease of description, only the parts related to the relevant invention are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
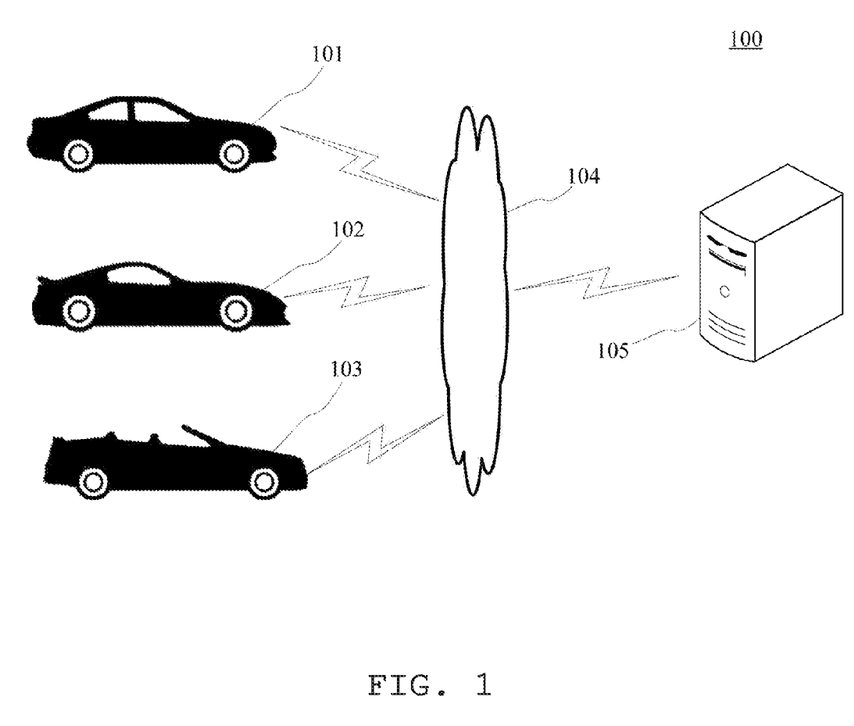
FIG. 1 is a diagram illustrating an exemplary system architecture in which the present application can be implemented.

FIG. 1 shows an exemplary system architecture 100 in which a data transmission method or a data transmission apparatus according to an embodiment of the present application may be implemented.

As shown in FIG. 1, the system architecture 100 may include driverless vehicles 101, 102, and 103, a network 104, and a server 105. The network 104 serves as a medium for providing communication links between the driverless vehicles 101, 102, and 103 and the server 105. The network 104 may include various connection types, such as wired and wireless communication links or optical fiber cables.

The driverless vehicles 101, 102, and 103 interact with the server 105 through the network 104 to receive or send a message or the like. Various data processing applications, for example, a position information application, a speed control application, a radar ranging application, a temperature control application, and a communication application, may be installed on the driverless vehicles 101, 102, and 103. The driverless vehicles 101, 102, and 103 may analyze acquired data to be transmitted, and convert the coding type of the data to be transmitted into a coding type that can be processed by an information receiving end receiving the data to be transmitted.

The driverless vehicles 101, 102, and 103 may be various vehicles having a plurality of data acquisition units and a data processing unit, including, but not limited to, electric vehicles, hybrid electric vehicles, internal combustion engine vehicles, and so on.

The server 105 may be a server for processing data to be transmitted of the driverless vehicles 101, 102, and 103, for example, a server for building and updating a transcoding model according to the coding type of the data to be transmitted and sending the transcoding model to the driverless vehicles 101, 102, and 103. The server 105 may analyze the data to be transmitted of the driverless vehicles 101, 102, and 103, determine the coding type of the data to be transmitted, and determine a coding type that can be recognized by the information receiving end, thus building and updating the transcoding model.

It should be noted that the data transmission method provided in this embodiment of the present application may be executed independently by the driverless vehicles 101, 102, and 103, or may be executed jointly by the driverless vehicles 101, 102, and 103 and the server 105. Generally, the data transmission method is executed by the driverless vehicles 101, 102, and 103. Correspondingly, a data transmission apparatus may be provided in the driverless vehicles 101, 102, and 103, or may be provided in the server 105.

It should be appreciated that the number of the driverless vehicles, networks, and servers in FIG. 1 are merely illustrative. Any number of driverless vehicles, networks, and servers may be provided according to actual requirements.

Figure 2:
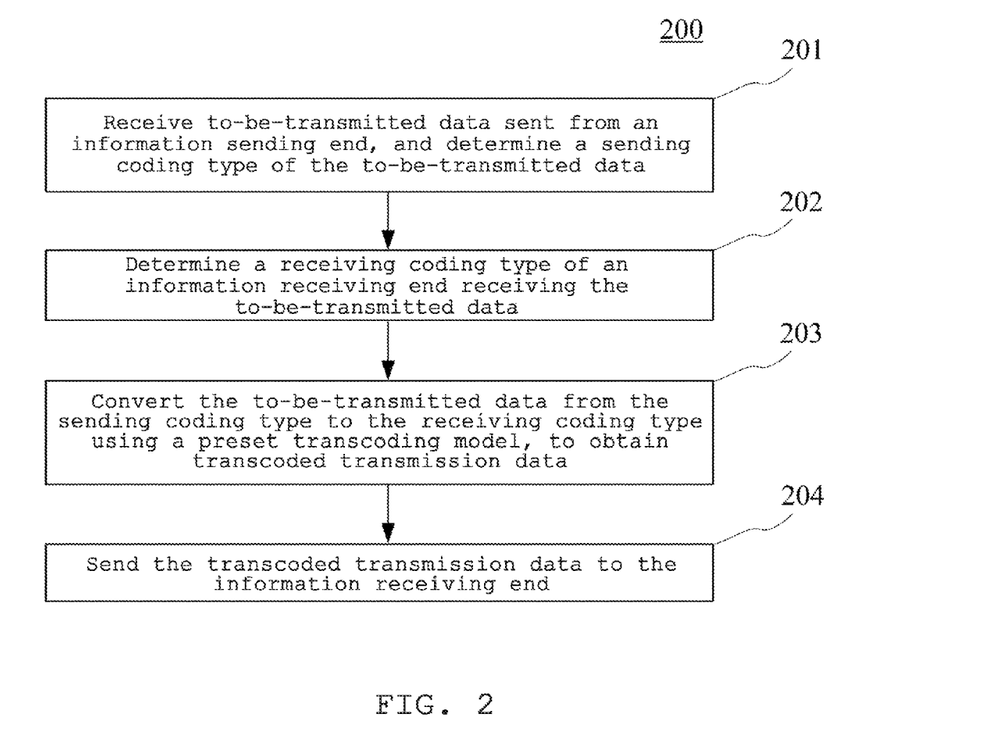
FIG. 2 is a flow chart of a data transmission method according to an embodiment of the present application.

FIG. 2 shows a flow 200 of a data transmission method according to an embodiment of the present application. The data transmission method includes:

Step 201, receive data to be transmitted sent from an information sending end, and determine a sending coding type of the data to be transmitted.

In this embodiment, an electronic device (for example, the driverless vehicle or the server shown in FIG. 1) on which the data transmission method runs may acquire data to be transmitted by means of a wired connection or a wireless connection. The data to be transmitted may include various types of data to be transmitted that are acquired by various sensors, for example, position data acquired by a GPS, data acquired by an inertial navigation system, distance data acquired by a radar, and temperature data acquired by a temperature sensor.

The driverless vehicle includes a plurality of sensors. The sensors send acquired data to other data processing units for data processing, and the control system of the driverless vehicle obtains a control instruction based on the processed data, thereby implementing automatic driving of the driverless vehicle. In practice, the coding type of data acquired by the sensor is usually different from the coding type that can be processed by the data processing unit. Therefore, the driverless vehicle needs to perform a plurality of data conversion processes during data processing. In each data conversion process, the sending coding type of the data to be transmitted needs to be determined first.

In some optional implementations of this embodiment, receiving the data to be transmitted sent from the information sending end, and determining the sending coding type of the data to be transmitted may include the following steps:

First step: Check sending coding type information of the above-mentioned data to be transmitted.

After the data to be transmitted is obtained, the sending coding type information of the data to be transmitted may be determined by checking the data flow name of the data to be transmitted.

Second step: Determine the sending coding type of the above-mentioned data to be transmitted based on the above-mentioned sending coding type information.

Once the sending coding type information is determined, the sending coding type of the data to be transmitted can be determined. For example, if the sending coding type information is data type information of a robot operating system, the data type of the data to be transmitted is robot operating system data.

Step 202, determine a receiving coding type of an information receiving end receiving the above-mentioned data to be transmitted.

After the sending coding type of the data to be transmitted is determined, the receiving coding type of the information receiving end receiving the data to be transmitted needs to be further determined. Generally, the data to be transmitted includes information about the information receiving end receiving the data to be transmitted, and the coding type required by the information receiving end can be queried based on the information.

In some optional implementations of this embodiment, determining the receiving coding type of the information receiving end receiving the above-mentioned data to be transmitted may include the following steps:

First step: Determine an information receiving end corresponding to the above-mentioned data to be transmitted, and send a request message to the above-mentioned information receiving end.

Information about the information receiving end that the data to be transmitted will reach is acquired from the data to be transmitted, and a request message is sent to the corresponding information receiving end based on the information. The above-mentioned request message is used for querying the receiving coding type of the above-mentioned information receiving end.

Second step: Receive a response message sent by the above-mentioned information receiving end in response to the above-mentioned request message.

After receiving the request message, the information receiving end returns a response message corresponding to the request message, the above-mentioned response message being used for indicating a receiving coding type corresponding to the above-mentioned information receiving end. The receiving coding type of the information receiving end may be determined based on the response message.

Step 203, convert the above-mentioned data to be transmitted from the above-mentioned sending coding type to the above-mentioned receiving coding type by using a preset transcoding model, to obtain transcoded transmission data.

The above-mentioned transcoding model is used for representing a corresponding relationship between the sending coding type and the receiving coding type. The transcoding model can determine a corresponding decoding module and encoding module based on the sending coding type of the data to be transmitted and the receiving coding type of the information receiving end receiving the data to be transmitted, and convert the data to be transmitted from the sending coding type into the receiving coding type, so as to obtain transcoded transmission data. The transcoded transmission data is data to be sent to the information receiving end. That is, the transcoded transmission data is data obtained after the data to be transmitted is transcoded based on the information receiving end.

In some optional implementations of this embodiment, the method of this embodiment may further include a step of building a transcoding model. The above-mentioned step of building a transcoding model may include the following steps:

First step: Acquire sending coding type information from information sending ends to form a sending coding type information set and acquire receiving coding type information from information receiving ends to form a receiving coding type information set.

In this embodiment, there are a plurality of information sending ends and a plurality of information receiving ends, and any one of the information sending ends can send data to be transmitted to any one of the information receiving ends. Likewise, any one of the information receiving ends can receive data sent from any one of the information sending ends. The information receiving ends and the information sending ends may be in a one-to-one transmission relationship, or may be in a one-to-many or many-to-one transmission relationship. The one-to-one transmission relationship means that one information sending end sends data to one information receiving end. The one-to-many transmission relationship means that one information sending end sends data to a plurality of information receiving ends. The many-to-one transmission relationship means that a plurality of information sending ends send data to one information receiving end.

To construct the sending coding type information set and the receiving coding type information set, request messages for acquiring sending coding type information may be sent to the information sending ends, and the sending coding type information set is constructed according to feedback messages including the sending coding type information and sent from the information sending ends. Similarly, the receiving coding type information may be obtained from the information receiving ends, thus constructing the receiving coding type information set.

Second step: Determine a decoding module for a sending coding type corresponding to the above-mentioned sending coding type information.

As can be known from the foregoing descriptions, the sending coding type may be determined based on the sending coding type information. There is a corresponding encoding rule for the sending coding type. Accordingly, a decoding module corresponding to the encoding rule may be found. The decoding module is used for decoding data to be transmitted of the sending coding type into data contents of a designated type. The number of sending coding types in the sending coding type information set corresponds to the number of decoding modules. The decoding module may decode the data to be transmitted, to obtain data contents from the data to be transmitted. The above-mentioned data contents include at least one of: text, picture, and video, or may be data of other types, which will not be described in detail here.

Third step: Determine an encoding module for converting the above-mentioned data contents into transcoded transmission data.

The decoding module can decode the data contents included in the data to be transmitted. After the data contents are obtained, the data contents need to be further encoded based on the receiving coding type of the corresponding information receiving end, to obtain transcoded transmission data. The above-mentioned transcoded transmission data is of a receiving coding type corresponding to the above-mentioned receiving coding type information, for data processing by an information receiving end. Each information receiving end may receive data sent from any information sending end. Therefore, the encoding module needs to further encode the data contents. The number of different receiving coding types corresponds to the number of encoding modules. In practice, the decoding module and the encoding module may both be implemented by programming.

Fourth step: Encapsulate the above-mentioned decoding module and the above-mentioned encoding module into a transcoding model corresponding to the above-mentioned sending coding type information and the above-mentioned receiving coding type information.

After the decoding module and the encoding module are determined, the decoding module and the encoding module are encapsulated to construct a transcoding model. As can be seen from the above-mentioned analysis of the encoding module and the decoding module, the encoding module and the decoding module may both be implemented by programming. Therefore, the encapsulation process may be considered as establishing a corresponding relationship between the decoding module and the encoding module.

In some optional implementations of this embodiment, converting the above-mentioned data to be transmitted from the above-mentioned sending coding type to the above-mentioned receiving coding type using the preset transcoding model, to obtain the transcoded transmission data may further include: updating the above-mentioned transcoding model using the receiving coding type of the above-mentioned data to be transmitted if the above-mentioned transcoding model cannot convert the above-mentioned data to be transmitted into the transcoded transmission data.

If the sending coding type of the data to be transmitted that is sent from the information sending end does not belong to the sending coding type information set, the corresponding transcoded transmission data cannot be obtained using the existing transcoding model. In this case, a decoding module corresponding to the sending coding type needs to be found, a corresponding encoding module needs to determined, and finally the decoding module and the encoding module need to be encapsulated, thus implementing the updating of the transcoding model.

Step 204, send the above-mentioned transcoded transmission data to the above-mentioned information receiving end.

After the transcoded transmission data is obtained by using the transcoding model, the transcoded transmission data is sent to the information receiving end according to a data connection relationship with the information receiving end, thus implementing the transcoding and transmission of the data to be transmitted from the information sending end to the information receiving end.

Figure 3:
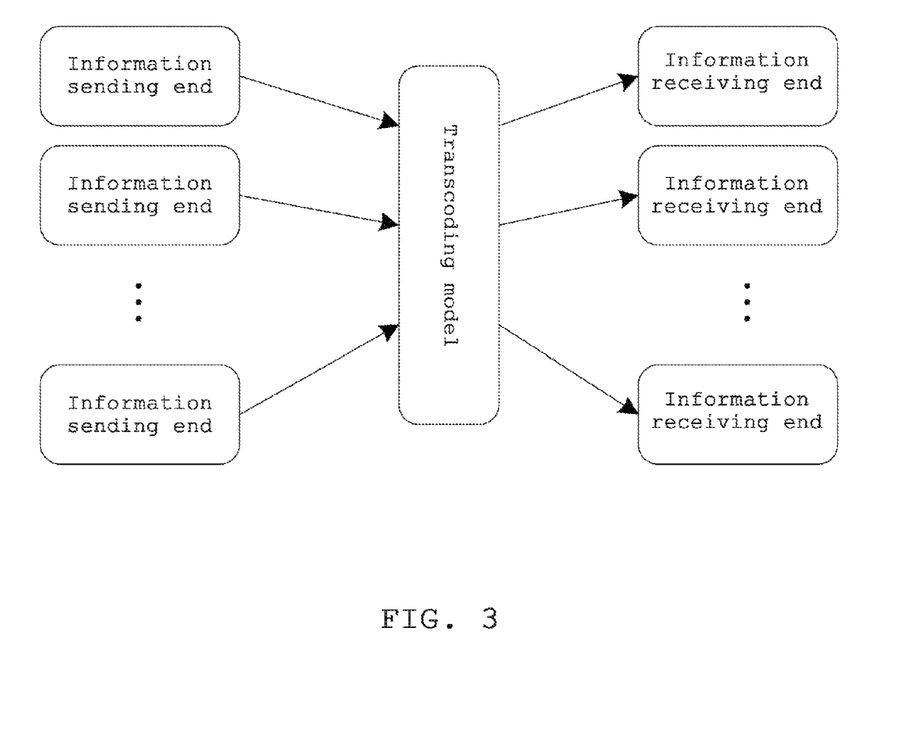
FIG. 3 is a schematic diagram of an application scenario of a data transmission method according to an embodiment of the present application.

Further referring to FIG. 3, a schematic diagram of an application scenario of the data transmission method according to this embodiment is shown. It can be seen from FIG. 3 that the transcoding model may connect a plurality of information sending ends to a plurality of information receiving ends. Sending coding types of data sent by the information sending ends to the transcoding model may be the same or different, and receiving coding types of the information receiving ends may also be the same or different. In addition, the transcoding model can simultaneously transcode data that is transmitted between a plurality of information sending ends and a plurality of information receiving ends. For example, in a driverless vehicle, data to be transmitted that is commonly used by the information sending ends and the information receiving ends may be robot operating system data or protocol cache data. These two types of data have different coding types. After the information sending end sends robot operating system data (or the protocol cache data) to a transcoding module, the transcoding module decodes the robot operating system data (or the protocol cache data) to obtain data contents included in the robot operating system data (or the protocol cache data), encodes the data contents based on a receiving coding type corresponding to an information receiving end receiving the robot operating system data (or the protocol cache data) to obtain corresponding protocol cache data (or robot operating system data), and then sends the obtained protocol cache data (or robot operating system data) to the information receiving end, thus implementing the dynamic data conversion of data to be processed.

According to the data transmission method provided by the present application, a sending coding type of data to be transmitted and a receiving coding type of an information receiving end receiving the data to be transmitted are determined first; then, the data to be transmitted is converted from the sending coding type to the receiving coding type using a corresponding transcoding model, to obtain transcoded transmission data. Thereby, the data transmission efficiency and the transcoding accuracy are improved.

Figure 4:
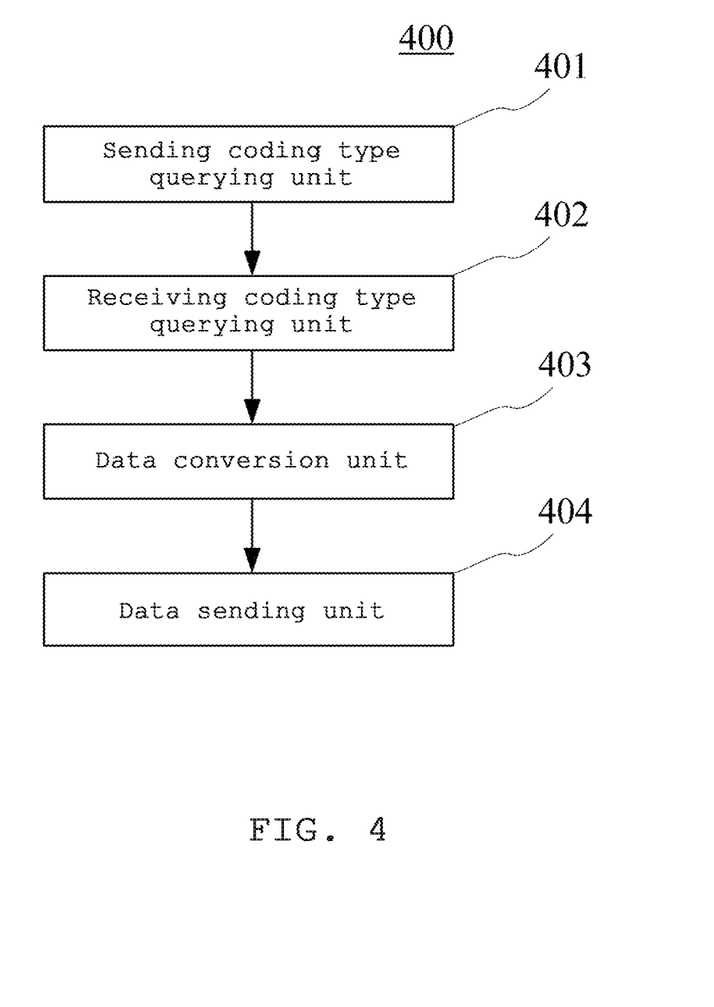
FIG. 4 is a schematic structural diagram of a data transmission apparatus according to an embodiment of the present application.

Further referring to FIG. 4, as an implementation of the methods shown in the above-mentioned figures, the present application provides an embodiment for a data transmission apparatus. This apparatus embodiment corresponds to the method embodiment shown in FIG. 2. The apparatus may be specifically applied to various electronic devices.

As shown in FIG. 4, this embodiment the above-mentioned data transmission apparatus 400 may include: a sending coding type querying unit 401, a receiving coding type querying unit 402, a data conversion unit 403, and a data sending unit 404. The sending coding type querying unit 401 is used for receiving data to be transmitted sent from an information sending end, and determining a sending coding type of the data to be transmitted. The receiving coding type querying unit 402 is used for determining a receiving coding type of an information receiving end receiving the above-mentioned data to be transmitted. The data conversion unit 403 is used for converting the above-mentioned data to be transmitted from the above-mentioned sending coding type to the above-mentioned receiving coding type using a preset transcoding model, to obtain transcoded transmission data, the above-mentioned transcoding model being used for representing a corresponding relationship between the sending coding type and the receiving coding type. The data sending unit 404 is used for sending the above-mentioned transcoded transmission data to the above-mentioned information receiving end.

In some optional implementations of this embodiment, the above-mentioned sending coding type querying unit 401 may include a coding type information querying subunit (not shown in the figure) and a coding type determining subunit (not shown in the figure). The coding type information querying subunit is used for querying sending coding type information of the above-mentioned data to be transmitted. The coding type determining subunit is used for determining the sending coding type of the above-mentioned data to be transmitted based on the above-mentioned sending coding type information.

In some optional implementations of this embodiment, the above-mentioned receiving coding type querying unit 402 includes a request message sending subunit (not shown in the figure) and a response message receiving subunit (not shown in the figure). The request message sending subunit is used for determining an information receiving end corresponding to the above-mentioned data to be transmitted, and sending a request message to the above-mentioned information receiving end, the above-mentioned request message being used for querying the receiving coding type of the above-mentioned information receiving end. The response message receiving subunit is used for receiving a response message that is sent by the above-mentioned information receiving end in response to the above-mentioned request message, the above-mentioned response message being used for indicating a receiving coding type corresponding to the above-mentioned information receiving end.

In some optional implementations of this embodiment, the data transmission apparatus 400 may further include: a transcoding model building unit (not shown in the figure), for building a transcoding model. The transcoding model building unit may further include a coding type information set constructing subunit (not shown in the figure), a decoding module determining subunit (not shown in the figure), an encoding module determining subunit (not shown in the figure), and a transcoding model building subunit (not shown in the figure). The coding type information set constructing subunit is used for acquiring sending coding type information from information sending ends to form a sending coding type information set and acquiring receiving coding type information from information receiving ends to form a receiving coding type information set. The decoding module determining subunit is used for determining a decoding module for a sending coding type corresponding to the above-mentioned sending coding type information, the above-mentioned decoding module being used for decoding data to be transmitted of the sending coding type into data contents of a designated type, the above-mentioned data contents including at least one of: text, picture, and video. The encoding module determining subunit is used for determining an encoding module for converting the above-mentioned data contents into transcoded transmission data, the above-mentioned transcoded transmission data being of a receiving coding type corresponding to the above-mentioned receiving coding type information, for data processing by an information receiving end. The transcoding model building subunit is used for encapsulating the above-mentioned decoding module and the above-mentioned encoding module into a transcoding model corresponding to the above-mentioned sending coding type information and the above-mentioned receiving coding type information.

In some optional implementations of this embodiment, the above-mentioned data conversion unit 403 may further include: a transcoding model updating subunit (not shown in the figure), for updating the above-mentioned transcoding model using the receiving coding type of the above-mentioned data to be transmitted if the above-mentioned transcoding model cannot convert the above-mentioned data to be transmitted into the transcoded transmission data.

Figure 5:
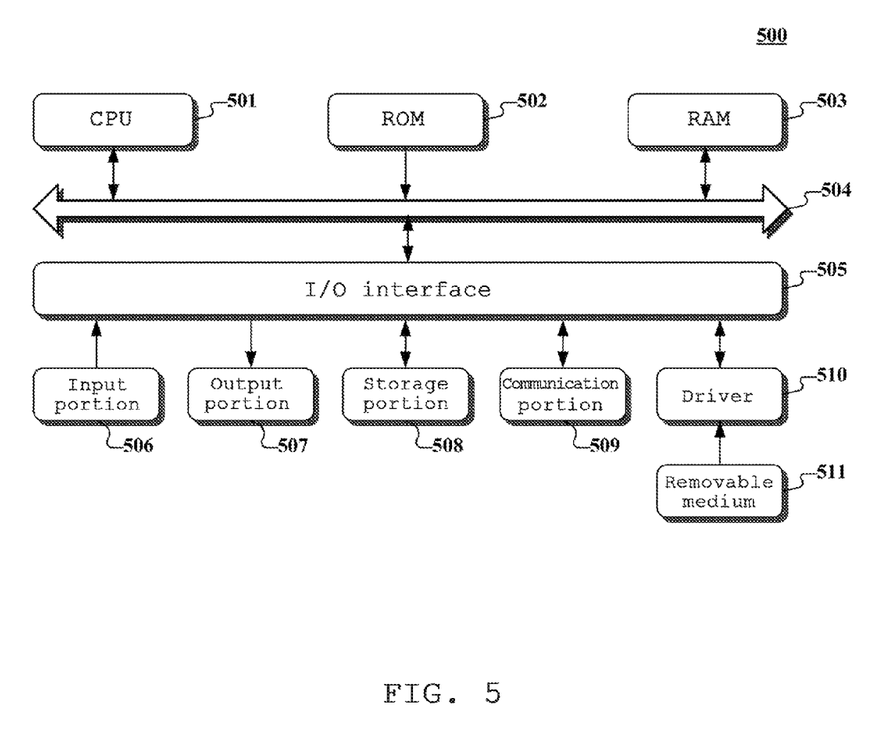
FIG. 5 is a schematic structural diagram of a server according to an embodiment of the present application.

Referring to FIG. 5, a schematic structural diagram of a computer system 500 adapted to implement a server of the embodiments of the present application is shown.

As shown in FIG. 5, the computer system 500 includes a central processing unit (CPU) 501, which may execute various appropriate actions and processes in accordance with a program stored in a read-only memory (ROM) 502 or a program loaded into a random access memory (RAM) 503 from a storage portion 508. The RAM 503 also stores various programs and data required by operations of the system 500. The CPU 501, the ROM 502 and the RAM 503 are connected to each other through a bus 504. An input/output (I/O) interface 505 is also connected to the bus 504.

The following components are connected to the I/O interface 505: an input portion 506 including a keyboard, a mouse etc.; an output portion 507 comprising a liquid crystal display device (LCD), a speaker etc.; a storage portion 508 including a hard disk and the like; and a communication portion 509 comprising a network interface card, such as a LAN card and a modem. The communication portion 509 performs communication processes via a network, such as the Internet. A driver 510 is also connected to the I/O interface 505 as required. A removable medium 511, such as a magnetic disk, an optical disk, a magneto-optical disk, and a semiconductor memory, may be installed on the driver 510, to facilitate the retrieval of a computer program from the removable medium 511, and the installation thereof on the storage portion 508 as needed.

In particular, according to an embodiment of the present disclosure, the process described above with reference to the flow charts may be implemented in a computer software program. For example, an embodiment of the present disclosure includes a computer program product, which comprises a computer program that is tangibly embedded in a machine-readable medium. The computer program comprises program codes for executing the method of the flow charts. In such an embodiment, the computer program may be downloaded and installed from a network via the communication portion 509, and/or may be installed from the removable media 511.

The flow charts and block diagrams in the figures illustrate architectures, functions and operations that may be implemented according to the system, the method and the computer program product of the various embodiments of the present invention. In this regard, each block in the flow charts and block diagrams may represent a module, a program segment, or a code portion. The module, the program segment, or the code portion comprises one or more executable instructions for implementing the specified logical function. It should be noted that, in some alternative implementations, the functions denoted by the blocks may occur in a sequence different from the sequences shown in the figures. For example, in practice, two blocks in succession may be executed, depending on the involved functionalities, substantially in parallel, or in a reverse sequence. It should also be noted that, each block in the block diagrams and/or the flow charts and/or a combination of the blocks may be implemented by a dedicated hardware-based system executing specific functions or operations, or by a combination of a dedicated hardware and computer instructions.

The units involved in the embodiments of the present application may be implemented by way of software or hardware. The described units may also be provided in a processor, for example, described as: a processor, comprising a sending coding type querying unit, a receiving coding type querying unit, a data conversion unit and a data sending unit, where the names of these units or modules are not considered as a limitation to the units or modules. For example, the data conversion unit may also be described as "a unit for converting a data coding type".

In another aspect, the present application further provides a computer readable storage medium. The computer readable storage medium may be the computer readable storage medium included in the apparatus in the above embodiments, or a stand-alone computer readable storage medium which has not been assembled into the apparatus. The computer readable storage medium stores one or more programs. The one or more programs, when executed by a device, cause the device to: receive to-be-transmitted data sent from an information sending end, and determine a sending coding type of the to-be-transmitted data; determine a receiving coding type of an information receiving end receiving the to-be-transmitted data; convert the to-be-transmitted data from the sending coding type to the receiving coding type using a preset transcoding model, to obtain transcoded transmission data, the transcoding model representing a corresponding relationship between the sending coding type and the receiving coding type; and send the transcoded transmission data to the information receiving end.

The foregoing is only a description of the preferred embodiments of the present application and the applied technical principles. It should be appreciated by those skilled in the art that the inventive scope of the present application is not limited to the technical solutions formed by the particular combinations of the above technical features. The inventive scope should also cover other technical solutions formed by any combinations of the above technical features or equivalent features thereof without departing from the concept of the invention, such as, technical solutions formed by replacing the features as disclosed in the present application with (but not limited to), technical features with similar functions.

What is claimed is:

1. A data transmission method, comprising:
   receiving to-be-transmitted data sent from an information sending end, and determining a sending coding type of the to-be-transmitted data;
   determining a receiving coding type of an information receiving end receiving the to-be-transmitted data;
   when an existing transcoding model exists, converting the to-be-transmitted data from the sending coding type to the receiving coding type using a preset transcoding model corresponding to the existing transcoding model, to obtain transcoded transmission data, the transcoding model representing a corresponding relationship between the sending coding type and the receiving coding type;
   building a new transcoding model when an existing transcoding model does not exist via performing the steps of:
      acquiring sending coding type information from information sending ends to form a sending coding type information set and acquiring receiving coding type information from information receiving ends to form a receiving coding type information set;
      determining a decoding module for a sending coding type corresponding to the sending coding type information, the decoding module decoding to-be-transmitted data of the sending coding type into data contents of a designated type, the data contents comprising at least one of: text, picture, and video;
      determining an encoding module for converting the data contents into transcoded transmission data, the transcoded transmission data being of a receiving coding type corresponding to the receiving coding type information, for data processing by the information receiving end; and
      encapsulating the decoding module and the encoding module into a transcoding model corresponding to the sending coding type information and the receiving coding type information; and,
   sending the transcoded transmission data to the information receiving end using one of (a) the preset transcoding model when an existing transcoding model exists, and (b) the new transcoding model when an existing transcoding model does not exist.

2. The method according to claim 1, wherein the receiving to-be-transmitted data sent from the information sending end, and determining the sending coding type of the to-be-transmitted data comprises:
   querying sending coding type information of the to-be-transmitted data; and
   determining the sending coding type of the to-be-transmitted data based on the sending coding type information.

3. The method according to claim 1, wherein the determining the receiving coding type of the information receiving end receiving the to-be-transmitted data comprises:
   determining an information receiving end corresponding to the to-be-transmitted data, and sending a request message to the information receiving end, the request message querying a receiving coding type of the information receiving end; and
   receiving a response message sent by the information receiving end in response to the request message, the response message indicating a receiving coding type corresponding to the information receiving end.

4. The method according to claim 1, wherein the converting the to-be-transmitted data from the sending coding type to the receiving coding type using the preset transcoding model, to obtain transcoded transmission data further comprises:
updating the transcoding model using the receiving coding type of the to-be-transmitted data if the transcoding model cannot convert the to-be-transmitted data into the transcoded transmission data.

5. A data transmission apparatus, comprising:
a sending coding type querying unit, for receiving to-be-transmitted data sent from an information sending end, and determining a sending coding type of the to-be-transmitted data;
a receiving coding type querying unit, for determining a receiving coding type of an information receiving end receiving the to-be-transmitted data;
a data conversion unit, for, when an existing transcoding model exists, converting the to-be-transmitted data from the sending coding type to the receiving coding type using a preset transcoding model corresponding to the existing transcoding model, to obtain transcoded transmission data, the transcoding model representing a corresponding relationship between the sending coding type and the receiving coding type, the data conversion unit including
a transcoding model building unit, for building a new transcoding model when an existing transcoding model does not exist, the transcoding model building unit comprising:
a coding type information set constructing subunit, for acquiring sending coding type information from information sending ends to form a sending coding type information set and acquiring receiving coding type information from information receiving ends to form a receiving coding type information set;
a decoding module determining subunit, for determining a decoding module for a sending coding type corresponding to the sending coding type information, the decoding module decoding to-be-transmitted data of the sending coding type into data contents of a designated type, the data contents comprising at least one of: text, picture, and video;
an encoding module determining subunit, for determining an encoding module for converting the data contents into transcoded transmission data, the transcoded transmission data being of a receiving coding type corresponding to the receiving coding type information, for data processing by the information receiving end; and
a transcoding model building subunit, for encapsulating the decoding module and the encoding module into a transcoding model corresponding to the sending coding type information and the receiving coding type information;
a data sending unit, for sending the transcoded transmission data to the information receiving end using one of (a) the preset transcoding model when an existing transcoding model exists, and (b) the new transcoding model when an existing transcoding model does not exist.

6. The apparatus according to claim 5, wherein the sending coding type querying unit comprises:
a coding type information querying subunit, for querying sending coding type information of the to-be-transmitted data; and
a coding type determining subunit, for determining the sending coding type of the to-be-transmitted data based on the sending coding type information.

7. The apparatus according to claim 5, wherein the receiving coding type querying unit comprises:
a request message sending subunit, for determining an information receiving end corresponding to the to-be-transmitted data, and sending a request message to the information receiving end, the request message querying a receiving coding type of the information receiving end; and
a response message receiving subunit, for receiving a response message sent by the information receiving end in response to the request message, the response message indicating a receiving coding type corresponding to the information receiving end.

8. The apparatus according to claim 5, wherein the data conversion unit further comprises:
a transcoding model updating subunit, for updating the transcoding model using the receiving coding type of the to-be-transmitted data if the transcoding model cannot convert the to-be-transmitted data into the transcoded transmission data.

9. A non-transitory storage medium storing one or more programs, the one or more programs when executed by a device, causing the device to perform a data transmission method, the data transmission method comprising:
receiving to-be-transmitted data sent from an information sending end, and determining a sending coding type of the to-be-transmitted data;
determining a receiving coding type of an information receiving end receiving the to-be-transmitted data;
when an existing transcoding model exists, converting the to-be-transmitted data from the sending coding type to the receiving coding type using a preset transcoding model corresponding to the existing transcoding model, to obtain transcoded transmission data, the transcoding model representing a corresponding relationship between the sending coding type and the receiving coding type;
building a new transcoding model when an existing transcoding model does not exist via performing the steps of:
acquiring sending coding type information from information sending ends to form a sending coding type information set and acquiring receiving coding type information from information receiving ends to form a receiving coding type information set;
determining a decoding module for a sending coding type corresponding to the sending coding type information, the decoding module decoding to-be-transmitted data of the sending coding type into data contents of a designated type, the data contents comprising at least one of: text, picture, and video;
determining an encoding module for converting the data contents into transcoded transmission data, the transcoded transmission data being of a receiving coding type corresponding to the receiving coding type information, for data processing by the information receiving end; and
encapsulating the decoding module and the encoding module into a transcoding model corresponding to the sending coding type information and the receiving coding type information; and, sending the transcoded transmission data to the information receiving end using one of (a) the preset transcoding model when an existing transcoding model exists, and (b) the new transcoding model when an existing transcoding model does not exist.

\* \* \* \* \*